US009287860B2

(12) United States Patent
Su

(10) Patent No.: US 9,287,860 B2
(45) Date of Patent: Mar. 15, 2016

(54) NEGATIVE RESISTANCE GENERATOR, LOAD INCLUDING NEGATIVE RESISTANCE AND LOAD OF AMPLIFIER

(71) Applicant: REALTEK SEMICONDUCTOR CORPORATION, Hsinchu (TW)

(72) Inventor: Hsuan-Yi Su, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/603,949

(22) Filed: Jan. 23, 2015

(65) Prior Publication Data

US 2015/0214936 A1 Jul. 30, 2015

(30) Foreign Application Priority Data

Jan. 27, 2014 (TW) .............................. 103103018 A

(51) Int. Cl.
*H03L 5/00* (2006.01)
*H03K 5/003* (2006.01)

(52) U.S. Cl.
CPC ..................................... *H03K 5/003* (2013.01)

(58) Field of Classification Search
None
See application file for complete search history.

(56) References Cited

U.S. PATENT DOCUMENTS

| 6,867,658 B1 * | 3/2005 | Sibrai | .................. H03B 5/1215 |
| | | | 331/117 FE |
| 2011/0156829 A1 * | 6/2011 | Wang | .................... H03L 7/0802 |
| | | | 331/117 FE |

OTHER PUBLICATIONS

Lu Hwang Hsin, "WLAN 802.11a VCO design with novel tank resonator", 2004.
Bibliography page of the WLAN 802.11a VCO design with novel tank resonator.

\* cited by examiner

*Primary Examiner* — Long Nguyen
(74) *Attorney, Agent, or Firm* — WPAT, P.C.; Anthony King

(57) ABSTRACT

A negative resistance generator is disclosed herein. The negative resistance generator includes a first signal end for receiving a first signal which includes first AC/DC components, a second signal end for receiving a second signal which includes second AC/DC components, first and second transistors, a power source circuit, a first and a second DC level setting circuits. The power source circuit is coupled to the first and second transistors. The first DC level setting circuit provides a second gate voltage for a second gate of the second transistor according to a first DC voltage and the first AC component. The second DC level setting circuit provides a first gate voltage for a first gate of the first transistor according to a second DC voltage and the second AC component. The second gate voltage and first gate voltage are lower than the voltages of the first and the second signal respectively.

12 Claims, 8 Drawing Sheets

NEGATIVE RESISTANCE GENERATOR, LOAD INCLUDING NEGATIVE RESISTANCE AND LOAD OF AMPLIFIER

BACKGROUND OF THE INVENTION

1. Field of the Invention

The present disclosure relates to a resistance generator and a load, especially to a negative resistance generator and a load including negative resistance.

2. Description of Related Art

An ideal inductor in comparison with a resistor has the feature of lossless DC (Direct Current) transmission. Therefore, in some circuit design, an inductor instead of a resistor is used as a load for the linearity improvement of circuit operation. For instance, when developing a low noise amplifier (LNA), an inductor could be used for impedance match and treated as a load such that the linearity of this amplifier would improve. However, as it is shown in FIG. 1a, an actual inductor is non-ideal and usually composed of an inductance L and a parasitic resistance Rs connected in series. If the inductance L and the resistance Rs in FIG. 1a are represented by a substitution of the inductance L and a resistance Rp connected in parallel (as shown in FIG. 1b), the relationship between the resistance Rs and the resistance Rp could be expressed with the following equation:

$$Rp=[(\omega L)^2]/Rs=Rs \times Q^2, \qquad (Eq.\ 1)$$

in which $Q=(\omega L)/Rs$ stands for the quality factor of the inductor (when it is expressed with the inductance L and the resistance Rs connected in series). In a general case, the more the Q value is, the less the parasitic resistance Rs is, which means that the DC transmission loss becomes minor and the inductor characteristic becomes better. However, in consideration of that the Q value is positively proportional to the size of an inductor in an integrated circuit while an inductor of greater size consumes more circuit area and lead to the increase of cost, the Q value has to be determined with a dilemma of sacrificing performance or cost benefit. In addition, when an inductor is used as a load, in order to get a higher gain of signals at a specific frequency, some prior art connects the inductor with a capacitor C in parallel (as shown in FIG. 1c) so as to neutralize the AC impedance of the inductor and the capacitor when a resonance of the inductance of the inductor L and the capacitor C occurs. Under the resonance, the impedance of the load is equivalent to the parasitic resistance Rp of the inductor (as shown in FIG. 1c). Consequently, if the parasitic resistance Rp (in relation to the impedance of the load) is increased, the signal gain (e.g., a transconductance gain gm multiplied by the resistance Rp of the load) becomes higher. But if the resistance Rp is increased to improve the signal gain, the increased resistance Rp also consumes more circuit area since the resistance Rp is positively proportional to the Q value (as shown in Eq. 1), which also leads to the increase of cost. As a result, a designer again faces the dilemma of sacrificing performance or cost benefit again.

In consideration of the above, in order to improve the Q value and to increase the impedance of the load in FIG. 1c under reasonable cost, a known technique connects a load (e.g., the load in FIG. 1c) with a negative resistor composed of an active device in parallel so as to derive a better Q value with an equivalent load impedance. Unfortunately, the active region of transistor(s) under this kind of technique is inclined to enter the linear region from the saturation region due to a larger AC (Alternating Current) signal swing, which causes the linearity to be worse and therefore required to be improved as well. The mentioned prior art is illustrated in the following document: Lu, Hwang-Hsin, "WLAN 802.11a VCO design with novel tank resonator", Department of Electrical Engineering, Chung Hua University, 2004.

SUMMARY OF THE INVENTION

In view of the problems of the prior art, an object of the present disclosure is to provide a negative resistance generator, a load including negative resistance and a load of an amplifier for the improvement over the prior art.

The present disclosure discloses a negative resistance generator capable of reducing a chance of the active region of transistors entering the triode region from the saturation region for linearity improvement. An embodiment of the negative resistance generator includes a first signal end, a second signal end, a first transistor, a second transistor, a power source circuit, a first DC level setting circuit and a second DC level setting circuit. The first signal end is operable to receive a first signal including a first AC (alternating current) component and a first DC (direct current) component. The second signal end is operable to receive a second signal including a second AC component and a second DC component. The first transistor includes a first high voltage-level electrode, a first low voltage-level electrode and a first gate, in which the first high voltage-level electrode connects with the first signal end. The second transistor includes a second high voltage-level electrode, a second low voltage-level electrode and a second gate, in which the second high voltage-level electrode connects with the second signal end. One end of the power source circuit is coupled with the first and second low voltage-level electrodes, and another end of the power source circuit is coupled with a voltage end. The first DC level setting circuit is coupled between the first signal end and the second gate and operable to provide a second gate voltage for the second gate according to a first DC voltage and the first AC component, in which the second gate voltage is lower than the voltage of the first signal. The second DC level setting circuit is coupled between the second signal end and the first gate and operable to provide a first gate voltage for the first gate according to a second DC voltage and the second AC component, in which the first gate voltage is lower than the voltage of the second signal.

The present disclosure also discloses a load including negative resistance, which is advantageous to load characteristics. An embodiment of the load includes a first signal end, a second signal end, a resonant circuit and a negative resistance generator. The first signal end is operable to receive a first signal including a first AC (alternating current) component and a first DC (direct current) component. The second signal end is operable to receive a second signal including a second AC component and a second DC component. The resonant circuit is coupled between the first and second signal ends and includes an inductor and a capacitor connected in parallel. The negative resistance generator includes a first transistor, a second transistor, a first DC level setting circuit and a second DC level setting circuit. The first transistor includes a first high voltage-level electrode, a first low voltage-level electrode and a first gate, in which the first high voltage-level electrode connects with the first signal end. The second transistor includes a second high voltage-level electrode, a second low voltage-level electrode and a second gate, in which the second high voltage-level electrode connects with the second signal end. One end of the power source circuit is coupled with the first and second low voltage-level electrodes, and another end of the power source circuit is coupled with a voltage end. The first DC level setting circuit is coupled between the first signal end and the second gate and operable to provide a second gate voltage for the second gate according to a first DC voltage and the first AC component, in which the second gate voltage is lower than the voltage of the first signal. The second DC level setting circuit is coupled between the second signal end and the first gate and operable to provide a first gate voltage for the first gate according to a second DC voltage and the second AC component, in which the first gate voltage is lower than the voltage of the second signal.

The present disclosure further discloses a load of an amplifier, which is capable of improving the linearity of the amplifier. An embodiment of the load includes a first amplifier output end, a second amplifier output end, a resonant circuit and a negative resistance generator. The first amplifier output end is operable to transmit a first signal including a first AC (alternating current) component and a first DC (direct current) component. The second amplifier output end is operable to transmit a second signal including a second AC component and a second DC component. The resonant circuit is coupled between the first and second amplifier output ends and includes an inductor and a capacitor connected in parallel. The negative resistance generator includes a first transistor, a second transistor, a power source circuit, a first DC level setting circuit and a second DC level setting circuit. The first transistor includes a first high voltage-level electrode, a first low voltage-level electrode and a first gate, in which the first high voltage-level electrode connects with the first amplifier output end. The second transistor includes a second high voltage-level electrode, a second low voltage-level electrode and a second gate, in which the second high voltage-level electrode connects with the second amplifier output end. One end of the power source circuit is coupled with the first and second low voltage-level electrodes, and another end of the power source circuit is coupled with a voltage end. The first DC level setting circuit is coupled between the first amplifier output end and the second gate and operable to provide a second gate voltage for the second gate according to a first DC voltage and the first AC component. The second DC level setting circuit is coupled between the second amplifier output end and the first gate and operable to provide a first gate voltage for the first gate according to a second DC voltage and the second AC component.

These and other objectives of the present disclosure no doubt becomes obvious to those of ordinary skill in the art after reading the following detailed description of the preferred embodiments that are illustrated in the various figures and drawings.

BRIEF DESCRIPTION OF THE DRAWINGS

FIG. 1b illustrates a circuit diagram equivalent to FIG. 1a.

DETAILED DESCRIPTION OF THE PREFERRED EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The present disclosure discloses a negative resistance generator, a load including negative resistance and a load of an amplifier, and the negative resistance generator, the load including negative resistance and the load of the amplifier are capable of reducing a chance of the active region of transistor(s) entering the triode region from the saturation region for linearity improvement. Each of the devices is applicable to an integrated circuit (e.g., an amplifier, an oscillator, or any circuit requiring better linearity) or a system device (e.g., a wireless communication device), and each of the devices could be carried out with components or steps equivalent to those described in this specification by those of ordinary skill in the art as long as the consequent implementation is practicable. In consideration of that some elements themselves in the present disclosure could be known, the detail of such elements are omitted provided that this omission does not dissatisfy the disclosure and enablement requirements.

Figure 1A:
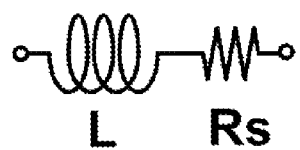
FIG. 1a illustrates a non-ideal inductor.
Figure 1B:
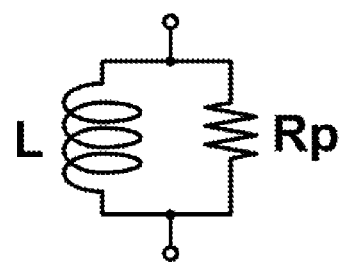
Figure 1C:
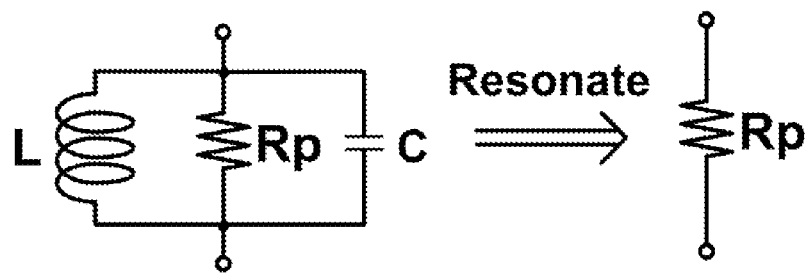
FIG. 1c illustrates a resonant circuit of the prior art.
Figure 2:
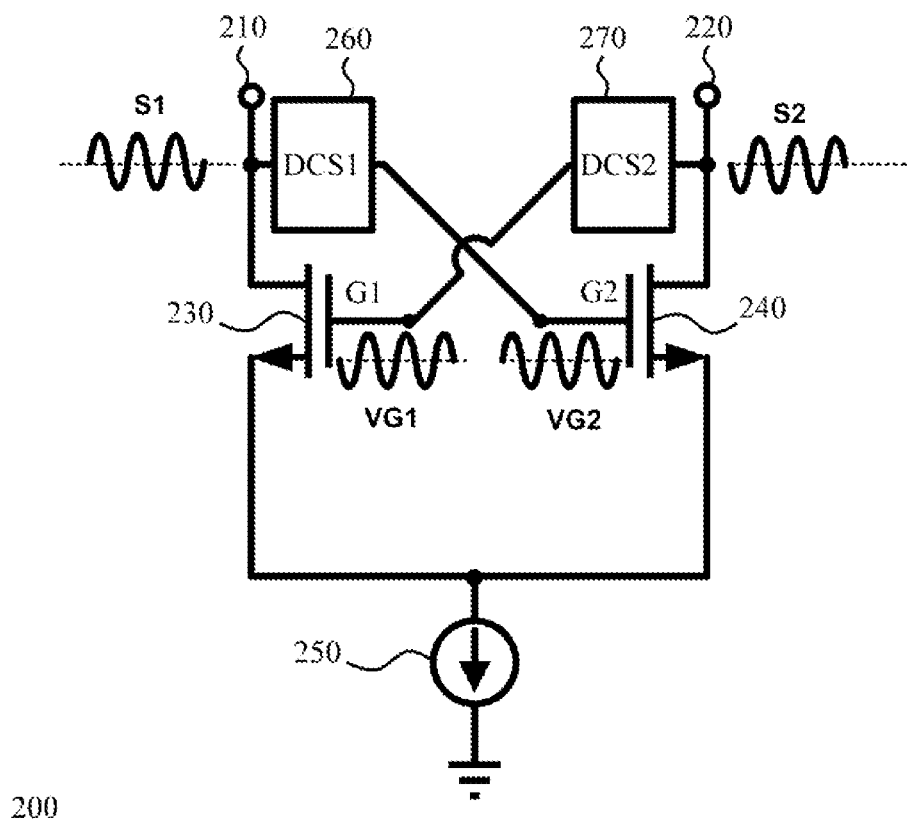
FIG. 2 illustrates an embodiment of the negative resistance generator of the present disclosure.

Referring to FIG. 2, an embodiment of the negative resistance generator of the present disclosure is presented. As it is shown in FIG. 2, the negative resistance generator 200 of this embodiment comprises a first signal end 210, a second signal 220, a first transistor 230, a second transistor 240, a power circuit 250, a first DC (Direct Current) level setting circuit (DCS1) 260 and a second DC level setting circuit (DCS2) 270. Said first signal end 210 is operable to receive a first signal S1 including a first AC component and a first DC component Said second signal end 220 is operable to receive a second signal S2 including a second AC component and a second DC component. In this embodiment, the second signal S2 is the inverse of the first signal S1. However, in an alternative embodiment, other relationships between the two signals could be adopted as long as the consequent implementation is practicable. Said first transistor 230 includes a first high voltage-level electrode, a first low voltage-level electrode and a first gate G1, in which the first high voltage-level electrode connects with the first signal end 210. In this embodiment, the first transistor 230 is an NMOS transistor, the first high voltage-level electrode is the drain, and the first low voltage-level electrode is the source. In an alternative embodiment, the first transistor 230 could be a PMOS transistor, consequently the first high voltage-level electrode is the source, and the first low voltage-level electrode is the drain. Similarly, said second transistor 240 includes a second high voltage-level electrode, a second low voltage-level electrode, and a second gate G2, in which the second high voltage-level electrode connects with the second signal end 220. In this embodiment, the second transistor 240 is an NMOS transistor, but could be a PMOS transistor instead in an alternative embodiment. Said power source circuit 250 in this embodiment is a current source circuit, in which one end of the power source circuit 250 is coupled with the first and second low voltage-level electrodes, and another end of the power source circuit 250 is coupled with a voltage end (e.g., a grounding end). However, the power circuit 250 could be a voltage source circuit or a voltage terminal as long as the consequently implementation is practicable. Said first DC level setting circuit 260 is coupled between the first signal end 210 and the second gate G2 and operable to provide a second gate voltage VG2 for the second gate G2 according to a first DC voltage and the first AC component of the first signal S1, in which the second gate voltage VG2 in this embodiment is lower than the voltage of the first signal S1 so as to enhance the capability of the second transistor 240 enduring the swings of the first signal S1 and the second signal S2. That is to say, the chance of the active region of the second transistor 240 entering the linear region (when the second transistor 240 is a NMOS transistor and conductive under $V_{DS}<V_{GS}-V_{th}$, or the second transistor 240 is a PMOS transistor and conductive under $V_{SD}<V_{SG}+V_{th}$) from the saturation region (when the second transistor 240 is a NMOS transistor and conductive under $V_{DS}>V_{GS}-V_{th}$, or the second transistor 240 is a PMOS transistor and conductive under $V_{SD}>V_{SG}+V_{th}$) is reduced, and thus the linearity of circuit operation is improved. Finally, said second DC level setting circuit 270 is coupled between the second signal end 220 and the first gate G1, and the said second DC level setting circuit 270 is operable to provide a first gate voltage VG1 for the first gate G1 according to a second DC voltage and the second AC component of the second signal S2, in which the first gate voltage VG1 is lower than the voltage of the second signal S2 so as to improve the tolerance of the first transistor 230 to the swings of the first and second signals S1, S2 and to prevent the active region of the first transistor 230 from entering the saturation region from the linear region.

Figure 3:
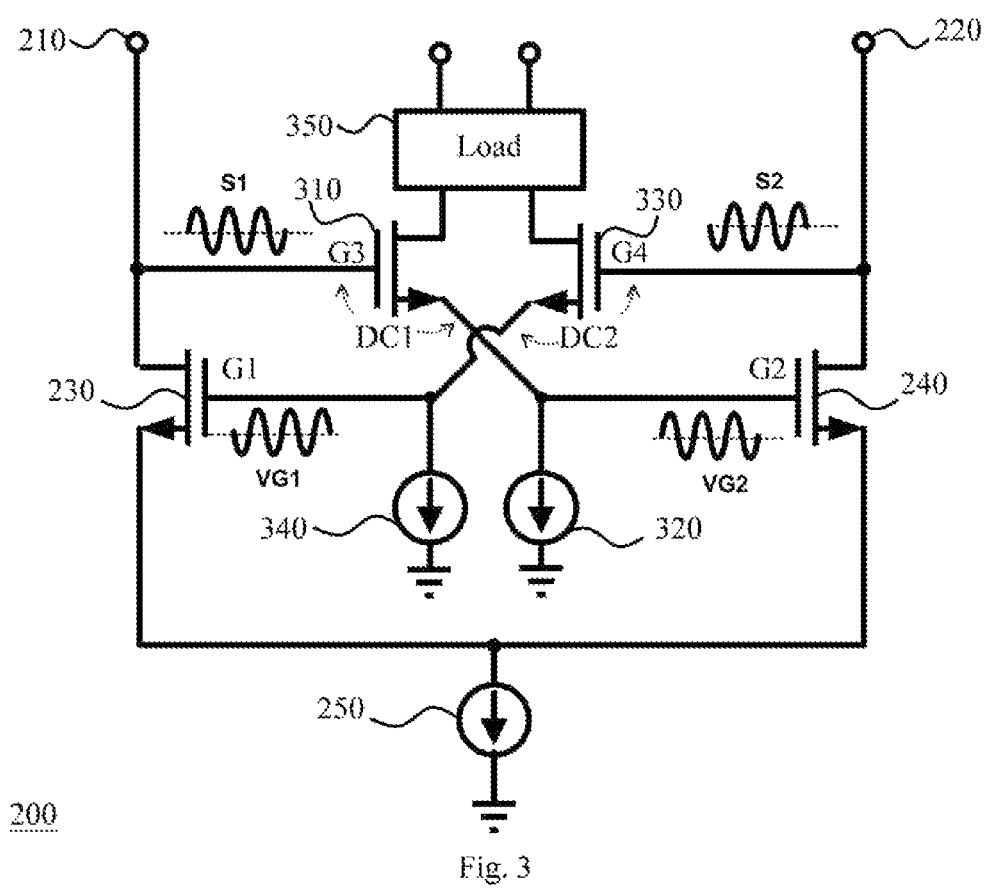
FIG. 3 illustrates an exemplary implementation of the first and second DC level setting circuits in FIG. 2.

Referring to FIG. 3, an embodiment of the first and second DC level setting circuits 260, 270 in FIG. 2 is presented. As shown in FIG. 3, both the first and second DC level setting circuits 260, 270 in this embodiment are source followers. More specifically, the first DC level setting circuit 260 includes a third transistor 310 and a first current source circuit 320, while the second DC level setting circuit 270 includes a fourth transistor 330 and a second current source circuit 340. Said third transistor 310 includes a third high voltage-level electrode, a third low voltage-level electrode and a third gate G3, in which the third high voltage-level electrode is coupled with a load circuit 350, the third low voltage-level electrode is coupled with the second gate G2, and the third gate G3 is coupled with the first signal end 210. Furthermore, the voltage difference between the voltages of the third gate G3 and the third low voltage-level electrode is the aforementioned first DC voltage DC1. Said first current source circuit 320 includes one end coupled with the third low voltage-level electrode and another end coupled with a first voltage end (e.g., a grounding end), and the first current is operable to determine the active region of the third transistor 310 in conjunction with the first signal S1 and the load circuit 350. In this embodiment, they are operable to make the active region of the third transistor 310 be the saturation region. Similarly, said fourth transistor 330 includes a fourth high voltage-level electrode, a fourth low voltage-level electrode and a fourth gate G4, in which the fourth high voltage-level electrode is coupled with the load circuit 350, the fourth low voltage-level electrode is coupled with the first gate G1, and the fourth gate G4 is coupled with the second signal end 220. Moreover, the voltage difference between the voltages of the fourth gate G4 and the fourth low voltage-level electrode is the aforementioned second DC voltage DC2. Said second current source circuit 340 includes one end coupled with the fourth low voltage-level electrode and another end coupled with a second voltage end (e.g., a grounding end), and the second current source circuit 340 is operable to determine the active region of the fourth transistor 330 in conjunction with the second signal S2 and the load circuit 350. In this embodiment, they are operable to make the active region of the third transistor 310 be the saturation region. It should be noted that since the transistors in this embodiment are NMOS transistors, the aforementioned first gate voltage VG1 here is equivalent to the voltage of the second signal S2 (i.e., the drain voltage of the second transistor 240) subtracting the second DC voltage DC2, and the aforementioned second gate voltage VG2 is equivalent to the voltage of the first signal S1 (i.e., the drain voltage of the first transistor 230) subtracting the first DC voltage DC1. Because a lower gate voltage is helpful to a transistor working in its saturation region while the drain voltage remains unchanged, the device adopting the present embodiment is able to improve its linearity.

Figure 4:
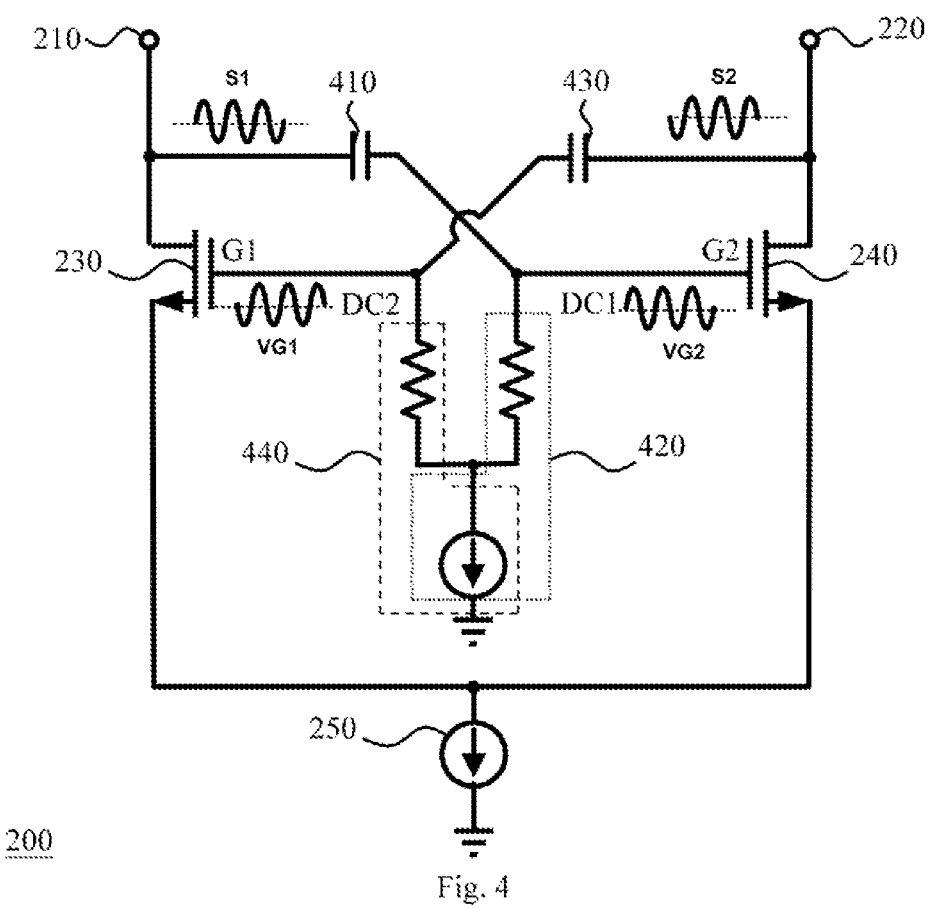
FIG. 4 illustrates another exemplary implementation of the first and second DC level setting circuits in FIG. 2.

Referring to FIG. 4, another embodiment of the first and second DC level setting circuits 260, 270 in FIG. 2 is presented. As it is shown in FIG. 4, the first DC level setting circuit 260 in this embodiment includes: a first capacitor 410, coupled between the first signal end 210 and the second gate G2, operable to stop the DC component of the first signal S1; and a first DC level generating circuit 420, coupled between the first capacitor 410 and a first voltage end (e.g., a grounding end), operable to provide the aforementioned first DC voltage DC1 (e.g., a voltage equal to or more than the DC voltage difference between the voltages of the second gate G2 and the second low voltage-level electrode) for the gate G2 of the second transistor 240. Accordingly, the second transistor 240 is able to operate in its saturation region while the DC component of the first signal S1 is blocked, in which the first DC voltage DC1 and the AC component of the first signal S1 cooperatively determine the gate voltage VG2 of the second transistor 240. Similarly, the second DC level setting circuit 270 includes: a second capacitor 430, coupled between the second signal end 220 and the first gate G1, operable to stop the DC component of the second signal S2; and a second DC level generating circuit 440, coupled between the second capacitor 430 and a second voltage end (e.g., a grounding end) which could be the above-mentioned first voltage end, operable to provide the aforementioned second DC voltage DC2 (e.g., a voltage not less than the DC voltage difference between the voltages of the first gate G1 and the first low voltage-level electrode) for the gate G1 of the first transistor 230 so as to ensure the first transistor 230 operating in the saturation region while the DC component of the second signal S2 is blocked, in which the second DC voltage DC2 and the AC component of the second signal S2 cooperatively determine the gate voltage VG1 of the first transistor 230.

It should be noted that the circuits in the embodiments of FIG. 2 through FIG. 4 adopt symmetric design. Therefore, the first DC voltage DC1 and the second DC voltage DC2 are equivalent in these embodiments, the first DC level setting circuit 260 and the second DC level setting circuit 270 are equivalent as well, and the other relationships can be derived in the same way. However, the present disclosure can adopt asymmetric circuit design instead as long as the consequent implementation is practicable. It should be further noted that although the transistors in the fore-disclosed embodiments are NMOS transistors, people of ordinary skill in the art may use other types of transistors instead given that the consequent implementation is practicable.

Figure 5:
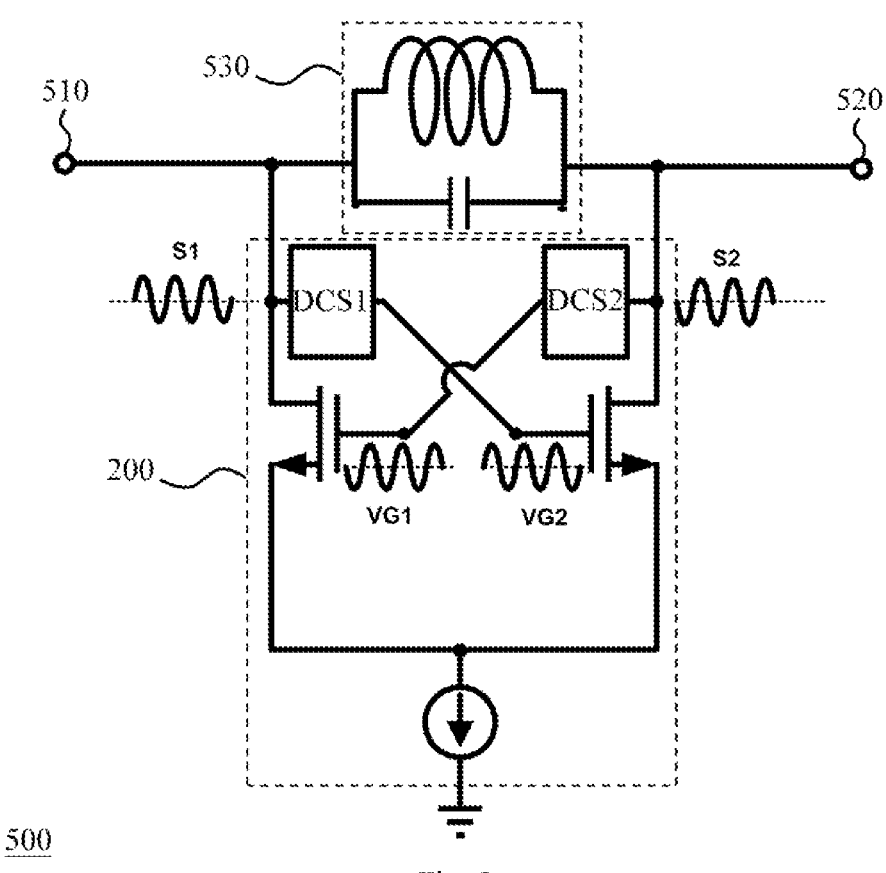
FIG. 5 illustrates an embodiment of the load including negative resistance of the present disclosure.

In addition to the above-disclosed negative resistance generator, the present disclosure also discloses a load including the negative resistance generator. This load is excellent in characteristics and capable of improving the linearity of a circuit using the load. Referring to FIG. 5, an embodiment of the load 500 comprises: a first signal end 510 operable to receive a first signal S1 including a first AC component and a first DC component; a second signal end 520 operable to receive a second signal S2 including a second AC component and a second DC component; a resonant circuit 530, coupled between the first and second signal ends 510, 520, including an inductor and a capacitor connected in parallel; and a negative resistance generator 200, connected with the resonant circuit 530 in parallel, including the circuit in FIG. 2 and the operation setting thereof or their equivalents. Since those of ordinary skill in the art are able to appreciate the detail and modification of FIG. 5 in accordance with the teaching and suggestion of the embodiments of FIG. 2 through FIG. 4, repeated and redundant explanation is therefore omitted while meeting the disclosure and enablement requirements.

Figure 6:
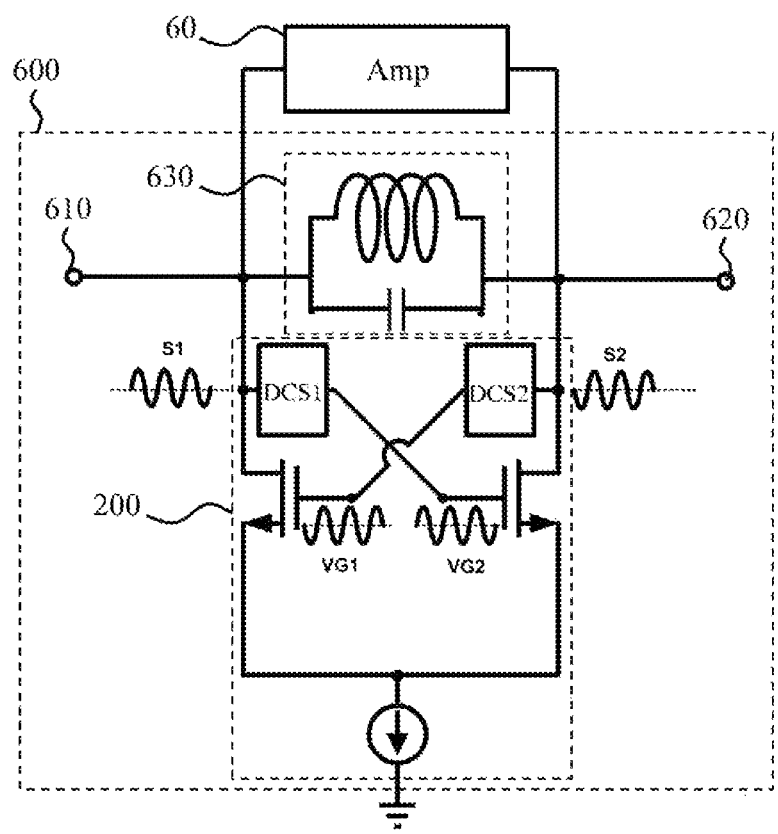
FIG. 6 illustrates an embodiment of the load of an amplifier of the present disclosure.

Additionally, as it is shown in FIG. 6, the present disclosure further discloses a load 600 applicable to an amplifier 60 (Amp) such as a low noise amplifier, comprising: a first amplifier output end 610 operable to transmit a first signal S1 including a first AC component and a first DC component; a second amplifier output end 620 operable to transmit a second signal S2 including a second AC component and a second DC component, in which the second signal S2 here is the inverse of the first signal S1; a resonant circuit 630, coupled between the first and second amplifier output ends 610, 620, including an inductor and a capacitor connected in parallel; and a negative resistance generator 200 connected with the resonant 630 in parallel, including the circuit in FIG. 2 and the operation setting thereof or their equivalents. Similarly, since people of ordinary skill in the art are able to appreciate the detail and modification of FIG. 6 in accordance with the teaching and suggestion of the embodiments of FIG. 2 through FIG. 4, repeated and redundant explanation is therefore omitted provided that the disclosure and enablement requirements are satisfied.

In the disclosed figures, some voltage ends are not marked with specific voltages, but the voltage ends can be determined in light of this specification and common knowledge by those of ordinary skill in the art. Therefore, unnecessary explanation is omitted. In addition, the shape, size, ratio, etc. of the elements in the figures are merely illustrative for understanding, not for the restriction on the scope of the present disclosure.

In summary, the negative resistance generator, the load including negative resistance, and the amplifier load of the present disclosure include at least the following merits: first, reducing the possibility of the active region of a transistor entering its linear region from its saturation region, and thereby enhancing the linearity of a circuit using the present disclosure; second, being a solution uncomplicated and easy to be realized without high cost in design and production; third, avoiding the dilemma of the prior art sacrificing performance or cost benefit.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A negative resistance generator, comprising:
   a first signal end, operable to receive a first signal including a first AC (alternating current) component and a first DC (direct current) component;
   a second signal end, operable to receive a second signal including a second AC component and a second DC component;
   a first transistor, including a first high voltage-level electrode, a first low voltage-level electrode and a first gate, in which the first high voltage-level electrode connects with the first signal end;
   a second transistor, including a second high voltage-level electrode, a second low voltage-level electrode and a second gate, in which the second high voltage-level electrode connects with the second signal end;
   a power source circuit, one end of the power source circuit coupled with the first and second low voltage-level electrodes, and another end of the power source circuit coupled with a voltage end;
   a first DC level setting circuit, coupled between the first signal end and the second gate, operable to provide a second gate voltage for the second gate according to a first DC voltage and the first AC component, in which the second gate voltage is lower than the voltage of the first signal and the first DC level setting circuit comprises:
      a third transistor, including a third high voltage-level electrode, a third low voltage-level electrode, and a third gate, in which the third high voltage-level electrode connects with a load circuit, the third low voltage-level electrode connects with the second gate, the third gate connects with the first signal end, and the voltage difference between the voltages of the third gate and the third low voltage-level electrode is the first DC voltage; and
      a first current source circuit, including one end coupled with the third low voltage-level electrode and another end coupled with a first voltage end, operable to determine an active region of the third transistor in conjunction with the first signal and the load circuit, and
   a second DC level setting circuit, coupled between the second signal end and the first gate, operable to provide a first gate voltage for the first gate according to a second DC voltage and the second AC component, in which the first gate voltage is lower than the voltage of the second signal and the second DC level setting circuit comprises:
      a fourth transistor, including a fourth high voltage-level electrode, a fourth low voltage-level electrode, and a fourth gate, in which the fourth high voltage-level electrode connects with the load circuit, the fourth low voltage-level electrode connects with the first gate, the fourth gate connects with the second signal end, and the voltage difference between the voltages of the fourth gate and the fourth low voltage-level electrode is the second DC voltage; and
      a second current source circuit, including one end coupled with the fourth low voltage-level electrode and another end coupled with a second voltage end, operable to determine an active region of the fourth transistor in conjunction with the second signal and the load circuit,
   wherein the first gate voltage is equal to the voltage of the second signal subtracting the second DC voltage, and the second gate voltage is equal to the voltage of the first signal subtracting the first DC voltage.

2. The negative resistance generator of claim 1, wherein the first DC voltage is equal to or higher than the DC voltage difference between the voltages of the second gate and the second low voltage-level electrode, and the second DC voltage is equal to or higher than the DC voltage difference between the voltages of the first gate and the first low voltage-level electrode.

3. The negative resistance generator of claim 1, wherein the first signal is the inverse of the second signal.

4. The negative resistance of claim 1, wherein both the first and second DC level setting circuits are source followers.

5. A load including negative resistance, comprising:
   a first signal end, operable to receive a first signal including a first AC (alternating current) component and a first DC (direct current) component;

a second signal end, operable to receive a second signal including a second AC component and a second DC component;

a resonant circuit, coupled between the first and second signal ends, including an inductor and a capacitor connected in parallel; and a negative resistance generator, including:

a first transistor, including a first high voltage-level electrode, a first low voltage-level electrode, and a first gate, in which the first high voltage-level electrode connects with the first signal end;

a second transistor, including a second high voltage-level electrode, a second low voltage-level electrode, and a second gate, in which the second high voltage-level electrode connects with the second signal end;

a power source circuit, one end of the power source circuit coupled with the first and second low voltage-level electrodes, and another end of the power source circuit coupled with a voltage end;

a first DC level setting circuit, coupled between the first signal end and the second gate, operable to provide a second gate voltage for the second gate according to a first DC voltage and the first AC component, in which the second gate voltage is lower than the voltage of the first signal and the first DC level setting circuit comprises:

a third transistor, including a third high voltage-level electrode, a third low voltage-level electrode, and a third gate, in which the third high voltage-level electrode connects with a load circuit, the third low voltage-level electrode connects with the second gate, the third gate connects with the first signal end, and the voltage difference between the voltages of the third gate and the third low voltage-level electrode is the first DC voltage; and a first current source circuit, including one end coupled with the third low voltage-level electrode and another end coupled with a first voltage end, operable to determine an active region of the third transistor in conjunction with the first signal and the load circuit, and a second DC level setting circuit, coupled between the second signal end and the first gate, operable to provide a first gate voltage for the first gate according to a second DC voltage and the second AC component, in which the first gate voltage is lower than the voltage of the second signal and the second DC level setting circuit comprises:

a fourth transistor, including a fourth high voltage-level electrode, a fourth low voltage-level electrode, and a fourth gate, in which the fourth high voltage-level electrode connects with the load circuit, the fourth low voltage-level electrode connects with the first gate, the fourth gate connects with the second signal end, and the voltage difference between the voltages of the fourth gate and the fourth low voltage-level electrode is the second DC voltage; and a second current source circuit, including one end coupled with the fourth low voltage-level electrode and another end coupled with a second voltage end, operable to determine an active region of the fourth transistor in conjunction with the second signal and the load circuit, wherein the first gate voltage is equal to the voltage of the second signal subtracting the second DC voltage, and the second gate voltage is equal to the voltage of the first signal subtracting the first DC voltage.

6. The load including negative resistance of claim 5, wherein the first signal is the inverse of the second signal.

7. The load including negative resistance of claim 5, wherein both the first and second DC level setting circuits are source followers.

8. The load including negative resistance of claim 5, wherein the first DC voltage is equal to or higher than the DC voltage difference between the voltages of the second gate and the second low voltage-level electrode, and the second DC voltage is equal to or higher than the DC voltage difference between the voltages of the first gate and the first low voltage-level electrode.

9. A load of an amplifier, comprising:

a first amplifier output end, operable to transmit a first signal including a first AC (alternating current) component and a first DC (direct current) component;

a second amplifier output end, operable to transmit a second signal including a second AC component and a second DC component;

a resonant circuit, coupled between the first and second amplifier output ends, including an inductor and a capacitor connected in parallel; and a negative resistance generator, including:

a first transistor, including a first high voltage-level electrode, a first low voltage-level electrode, and a first gate, in which the first high voltage-level electrode connects with the first amplifier output end;

a second transistor, including a second high voltage-level electrode, a second low voltage-level electrode, and a second gate, in which the second high voltage-level electrode connects with the second amplifier output end;

a power source circuit, one end of the power source circuit coupled with the first and second low voltage-level electrodes, and another end of the power source circuit coupled with a voltage end;

a first DC level setting circuit, coupled between the first amplifier output end and the second gate, operable to provide a second gate voltage for the second gate according to a first DC voltage and the first AC component, including:

a third transistor, including a third high voltage-level electrode, a third low voltage-level electrode, and a third gate, in which the third high voltage-level electrode connects with a load circuit, the third low voltage-level electrode connects with the second gate, the third gate connects with the first signal end, and the voltage difference between the voltages of the third gate and the third low voltage-level electrode is the first DC voltage; and a first current source circuit, including one end coupled with the third low voltage-level electrode and another end coupled with a first voltage end, operable to determine an active region of the third transistor in conjunction with the first signal and the load circuit, and a second DC level setting circuit, coupled between the second amplifier output end and the first gate, operable to provide a first gate voltage for the first gate according to a second DC voltage and the second AC component, including:

a fourth transistor, including a fourth high voltage-level electrode, a fourth low voltage-level electrode, and a fourth gate, in which the fourth high voltage-level electrode connects with the load circuit, the fourth low voltage-level electrode connects with the first gate, the fourth gate connects with the second signal end, and the voltage difference between the voltages of the fourth gate and the fourth low voltage-level electrode is the second DC voltage; and a second current source circuit, including one end coupled with the fourth low voltage-level electrode and another end coupled with a second voltage end, operable to determine an active region of the fourth transistor in conjunction with the second signal and the load circuit, wherein the first gate voltage is equal to the voltage of the second signal subtracting the second DC voltage, and the second gate voltage is equal to the voltage of the first signal subtracting the first DC voltage.

10. The load of the amplifier of claim 9, wherein the first gate voltage is lower than the voltage of the second signal, and the second gate voltage is lower than the voltage of the first signal.

11. The load of the amplifier of claim 10, wherein the first DC voltage is equal to or higher than the DC voltage difference between the voltages of the second gate and the second low voltage-level electrode, and the second DC voltage is equal to or higher than the DC voltage difference between the voltages of the first gate and the first low voltage-level electrode.

12. The load of the amplifier of claim 9, wherein the first DC voltage is equal to or higher than the DC voltage difference between the voltages of the second gate and the second low voltage-level electrode, and the second DC voltage is equal to or higher than the DC voltage difference between the voltages of the first gate and the first low voltage-level electrode.

* * * * *